(12) United States Patent
Taniike (10) Patent No.: US 10,571,808 B2
(45) Date of Patent: Feb. 25, 2020

(54) POLARIZED LIGHT IRRADIATION APPARATUS AND PHOTOSENSITIVE FILM-COATED SUBSTRATE MANUFACTURING METHOD

(71) Applicant: SHARP KABUSHIKI KAISHA, Sakai, Osaka (JP)

(72) Inventor: Kohshiroh Taniike, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/205,130

(22) Filed: Nov. 29, 2018

(65) Prior Publication Data
US 2019/0171112 A1 Jun. 6, 2019

(30) Foreign Application Priority Data
Dec. 1, 2017 (JP) ................................. 2017-231942

(51) Int. Cl.
G03B 27/52 (2006.01)
G03F 7/20 (2006.01)

(52) U.S. Cl.
CPC ................................. *G03F 7/70191* (2013.01)

(58) Field of Classification Search
CPC ............. G02F 1/133528; G02F 1/1334; G02F 1/13378; G02F 1/1341; G02F 1/1347; G02F 1/1362; G02F 2001/133614; G02F 1/017; G02F 1/133365; G02F 1/133504; G02F 2001/133357; G02F 2001/13775; G02F 2201/122; G02F 2201/44; G02F 2202/023; C09K 19/56; G02B 5/3016; G02B 5/30; G02B 1/08; G02B 27/286; G02B 27/4261

See application file for complete search history.

(56) References Cited

U.S. PATENT DOCUMENTS

2002/0039627 A1* 4/2002 Ichihashi ............... C09K 19/56
428/1.1
2006/0057306 A1* 3/2006 Shiotani ............ G02F 1/133788
428/1.2

FOREIGN PATENT DOCUMENTS

| JP | H11-218765 A | 8/1999 |
| JP | 2003-156687 A | 5/2003 |
| JP | 2007-226122 A | 9/2007 |

* cited by examiner

*Primary Examiner* — Mesfin T Asfaw
(74) *Attorney, Agent, or Firm* — ScienBiziP, P.C.

(57) ABSTRACT

Provided is a polarized light irradiation apparatus for exposure of a photosensitive film on a substrate. The polarized light irradiation apparatus includes: a transport stage including a stage surface that is reciprocated in a state where the substrate is placed on the stage surface and a heating mechanism that heats the substrate placed on the stage surface; and a polarized light irradiation mechanism irradiates the stage surface moving in an exposure region with polarized light. The transport stage moves in the exposure region at a first average speed in a forward path while heating the substrate by the heating mechanism. The transport stage moves in the exposure region at a second average speed lower than the first average speed in a backward path while heating the substrate by the heating mechanism.

12 Claims, 6 Drawing Sheets

POLARIZED LIGHT IRRADIATION APPARATUS AND PHOTOSENSITIVE FILM-COATED SUBSTRATE MANUFACTURING METHOD

BACKGROUND OF THE INVENTION

Field of the Invention

The present invention relates to a polarized light irradiation apparatus and a photosensitive film-coated substrate manufacturing method.

Description of Related Art

A liquid crystal display device that controls the alignment of liquid crystal molecules in a liquid crystal layer sealed between a pair of substrates to perform display is generally configured to have an alignment film between each of the pair of substrates and the liquid crystal layer. The alignment film can control the alignment directions and pre-tilt angles of adjacent liquid crystal molecules. In order to express an alignment regulating force for controlling the alignment directions of the liquid crystal molecules or the like, alignment treatment techniques such as a rubbing method and a photo-alignment method are used.

The photo-alignment method is a highly stable technique capable of aligning the liquid crystal molecules with high precision, and is widely developed as an alignment treatment technique that is used in place of the rubbing method. On the other hand, in consideration of productivity, the photo-alignment method disadvantageously has initial investment cost and a treatment time larger than those of the rubbing method. In the rubbing method in which the surface of the alignment film is rubbed with a cloth or the like, the treatment time can be shortened by improving brush contact to the alignment film, or increasing the rotation number of a rubbing roll. However, in the photo-alignment method in which an alignment film material is irradiated with polarized light, a high-sensitive material and a process technique for providing an efficient reaction are required to be developed in order to shorten the treatment time.

As a method of improving the reactivity of a photosensitive film such as an alignment film, a method of using polarized light irradiation and heating in combination has been studied (for example, Patent Documents 1, 2 and 3, or the like).

JP-A-H11-218765 discloses a method of aligning a polymer thin film. The polymer thin film having a portion capable of being aligned by linearly polarized light and having a glass transition temperature of 200° C. or higher is irradiated with linearly polarized light in a state where the portion capable of being aligned can easily move. JP-A-H11-218765 discloses the provision of the state where the portion capable of being aligned can easily move during heating.

JP-A 2003-156687 discloses a polarized light irradiation apparatus including an optical system that provides polarized light irradiation and a work stage on which a work having a photo-alignment film formed thereon is placed. A work stage heating unit is provided on the work stage; the work stage is housed in a treatment chamber having a gas introduction port; a transmission plate that transmits polarized light is provided on a part of a wall forming the treatment chamber; the transmission plate is supported on the wall of the treatment chamber with an elastic member interposed therebetween; the transmission plate is disposed so as to be in contact with only an elastic member so that the elastic member is deformed by the thermal expansion of the transmission plate; the treatment chamber is filled with dry gas to be introduced from the gas introduction port; and the work is irradiated with the polarized light via the transmission plate in a state where the work stage is heated by the work stage heating unit.

JP-A 2007-226122 discloses a method of manufacturing a liquid crystal display device. The liquid crystal display device includes a liquid crystal panel including one substrate including a first alignment film on an uppermost layer on a main surface on which active elements for pixel selection are formed, the other substrate including a second alignment film on an uppermost layer on a main surface on which color filters are formed, and a liquid crystal sealed between the first alignment film of the one substrate and the second alignment film of the other substrate. At least the first alignment film is irradiated with polarized light to perform an alignment treatment for imparting liquid crystal alignment control ability. A heating-polarized light irradiating step of irradiating the alignment film with the polarized light while heating the substrate and a heating-polarized light non-irradiating step of performing only the heating without providing the polarized light irradiation impart the alignment control ability to the alignment film.

In an alignment technique using polarized light irradiation and heating in combination, it is common to take a standby time until the temperature of a substrate becomes constant, and then provide polarized light irradiation. The standby time is taken, which causes a longer treatment time. When only the heating is performed during the standby time, a solvent volatilizes, which may cause low reactivity of a photosensitive film material. Thus, the alignment technique using the polarized irradiation and the heating in combination makes it necessary to optimize the energy balance between light and heat, and more studies are needed for the alignment technique.

BRIEF SUMMARY OF THE INVENTION

The present invention has been made in view of such a current state of the art, and aims to provide a polarized light irradiation apparatus that can provide efficient polarized light irradiation to form a photosensitive film exhibiting high anisotropy, and a photosensitive film-coated substrate manufacturing method.

The present inventors made various investigations concerning a method of efficiently subjecting a polarized light irradiation apparatus that uses polarized light irradiation and heating in combination to an exposure treatment. The present inventors noted a standby time for which only heating was conventionally performed until the temperature of a substrate reached a certain temperature, and found that the treatment time can be shortened by polarized light irradiation performed also during the standby time. On the other hand, the present inventors noted that the reactivity of a photosensitive film material depended on a temperature, and found that, when polarized light irradiation is provided before the temperature of the substrate becomes constant, the refractive index anisotropy of a photosensitive film is not sufficiently obtained. The present inventors made more investigations, and found that, by providing polarized light irradiation while heating the substrate, moving the substrate at a high speed in a state where the temperature of the substrate is not stable, or moving the substrate at a low speed in a state where the temperature of the substrate is constant, an exposure amount is maximized while an increase in a treatment time is suppressed, to allow a photosensitive film exhibiting high anisotropy to be efficiently formed. These findings have now led to completion of the present invention.

That is, one aspect of the present invention is a polarized light irradiation apparatus for exposure of a photosensitive film on a substrate, the polarized light irradiation apparatus including: a transport stage including a stage surface configured to reciprocate in a state where the substrate is placed on the stage surface and a heating mechanism configured to heat the substrate placed on the stage surface; and a polarized light irradiation mechanism configured to irradiate the stage surface moving in an exposure region with polarized light, the transport stage moving in the exposure region at a first average speed in a forward path while heating the substrate by the heating mechanism, the transport stage moving in the exposure region at a second average speed lower than the first average speed in a backward path while heating the substrate by the heating mechanism.

Another aspect of the present invention is a polarized light irradiation apparatus for exposure of a photosensitive film on a substrate, the polarized light irradiation apparatus including: a transport stage including a stage surface configured to move in a state where the substrate is placed on the stage surface and a heating mechanism configured to heat the substrate placed on the stage surface; and a first polarized light irradiation mechanism and a second polarized light irradiation mechanism configured to irradiate the stage surface moving in an exposure region with polarized light, the transport stage moving in the exposure region of the first polarized light irradiation mechanism at a first average speed while heating the substrate by the heating mechanism, and then moving in the exposure region of the second polarized light irradiation mechanism at a second average speed lower than the first average speed while heating the substrate by the heating mechanism.

In one aspect and the other aspect of the present invention, a speed of the transport stage moving at the first average speed may be a constant speed, or may be accelerated or decelerated.

In one aspect and the other aspect of the present invention, a speed of the transport stage moving at the second average speed may be a constant speed, or may be accelerated or decelerated.

Still another aspect of the present invention is a photosensitive film-coated substrate manufacturing method for irradiating a photosensitive film on a substrate with polarized light, the photosensitive film-coated substrate manufacturing method including irradiating the photosensitive film with polarized light while heating and moving the substrate, the irradiating including first irradiating performed by moving the substrate at a first average speed and second irradiating performed by moving the substrate after the first irradiating at a second average speed lower than the first average speed.

In still another aspect of the present invention, it is preferable that the irradiating is performed by irradiating the photosensitive film with polarized light while reciprocating the substrate; the first irradiating is performed in a forward path; and the second irradiating is performed in a backward path.

In still another aspect of the present invention, a moving speed of the substrate in the first irradiating may be a constant speed, or may be accelerated or decelerated.

In still another aspect of the present invention, a moving speed of the substrate in the second irradiating may be a constant speed, or may be accelerated or decelerated.

The present invention can provide a polarized light irradiation apparatus that can provide efficient polarized light irradiation to form a photosensitive film exhibiting high anisotropy, and a photosensitive film-coated substrate manufacturing method.

DETAILED DESCRIPTION OF THE INVENTION

Hereinafter, the present invention is described in more detail based on embodiments with reference to the drawings. The embodiments, however, are not intended to limit the scope of the present invention. The configurations of the embodiments may appropriately be combined or modified within the spirit of the present invention.

[Photosensitive Film-Coated Substrate Manufacturing Method]

First, with reference to FIGS. 1A, 1B and 2, a photosensitive film-coated substrate manufacturing method of the present invention will be described. A photosensitive film-coated substrate manufacturing method of the present invention is a photosensitive film-coated substrate manufacturing method that irradiates a photosensitive film on a substrate with polarized light. The method includes irradiating the photosensitive film with polarized light while heating and moving the substrate. The irradiating includes first irradiating performed by moving the substrate at a first average speed and second irradiating performed by moving the substrate after the first irradiating at a second average speed lower than the first average speed.

In the irradiating, by irradiating a photosensitive film 31 with polarized light, polymers constituting the photosensitive film 31 can be aligned in a desired direction. Thereby, anisotropy can be expressed in the photosensitive film 31. FIGS. 1A and 1B are schematic views showing a part of a polarized light irradiation apparatus of an embodiment 1 and an example of a photosensitive film-coated substrate manufacturing method using the polarized light irradiation apparatus of the embodiment 1. FIG. 1A shows first irradiating (forward path), and FIG. 1B shows second irradiating (backward path). As shown in FIGS. 1A and 1B, it is preferable that the irradiating is performed by irradiating a photosensitive film 31 with polarized light while reciprocating a substrate 30; the first irradiating is performed in the forward path; and the second irradiating is performed in the backward path. In the irradiating, by reciprocating the substrate 30, the substrate 30 can be efficiently irradiated with polarized light in a small space.

Figure 2:
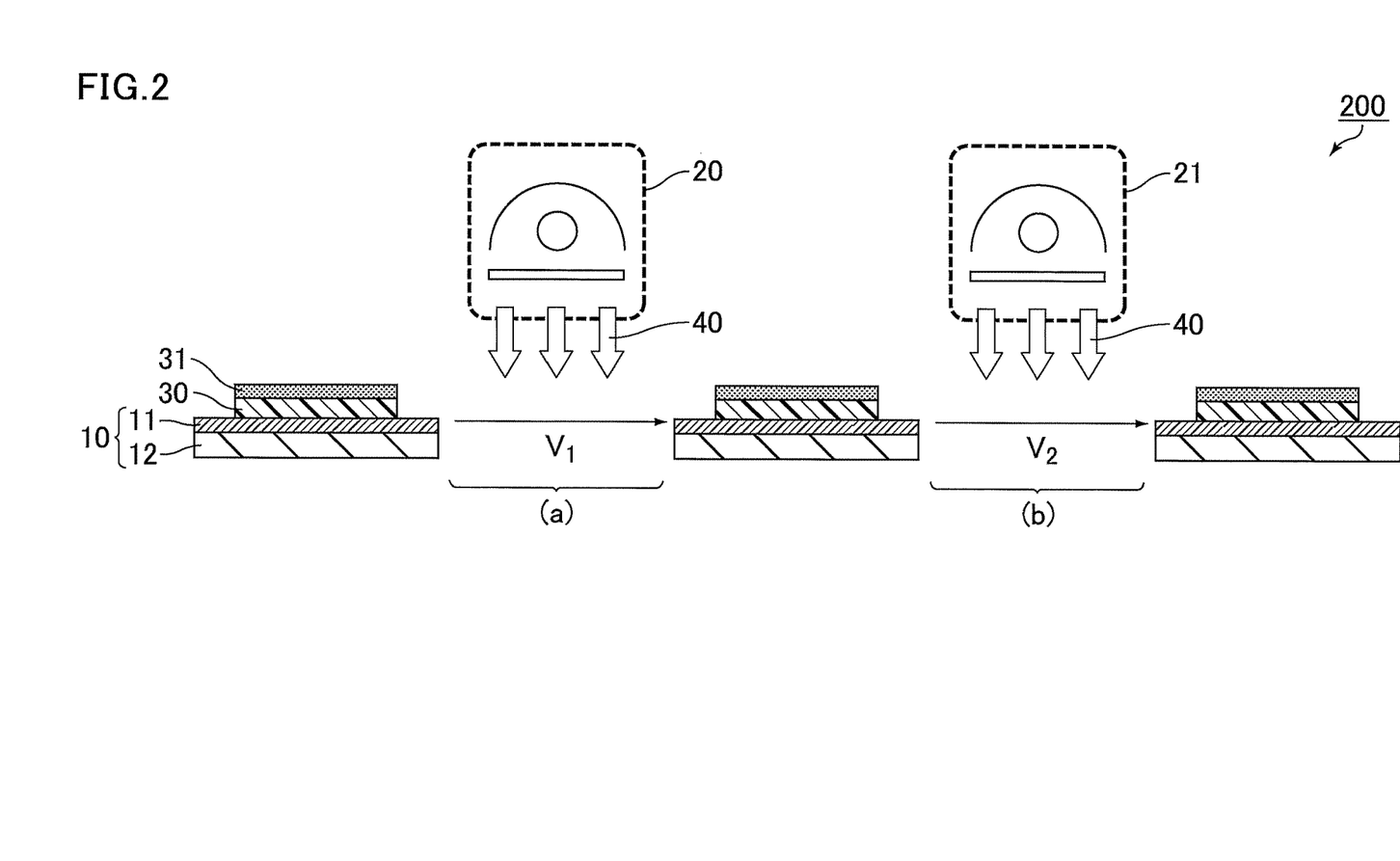
FIG. 2 is a schematic view showing a part of a polarized light irradiation apparatus of an embodiment 2 and an example of a photosensitive film-coated substrate manufacturing method using the polarized light irradiation apparatus of the embodiment 2.

FIG. 2 is a schematic view showing a part of a polarized light irradiation apparatus of an embodiment 2 and an example of a photosensitive film-coated substrate manufacturing method using the polarized light irradiation apparatus of the embodiment 2. A mark (a) in FIG. 2 shows first irradiating, and a mark (b) in FIG. 2 shows second irradiating. As shown in FIG. 2, the first irradiating and the second irradiating can also be performed by moving the substrate 30 in one direction without reciprocating the substrate 30.

The photosensitive film 31 is not limited as long as it is a photosensitive film, but it is preferably a photo-alignment film. The alignment film is a member included in a liquid crystal panel, and is provided on each of the surfaces of a pair of substrates with which a liquid crystal layer is sandwiched. The alignment film expressing anisotropy during exposure (photo-alignment treatment) is referred to as a photo-alignment film. The photo-alignment film expressing anisotropy has an alignment regulating force for controlling the alignments of liquid crystal molecules in the liquid crystal layer present in the vicinity the photo-alignment film. For example, in a liquid crystal panel in which a liquid crystal layer is sandwiched between the obtained pair of photosensitive film-coated substrate, the alignment directions of liquid crystal molecules when no voltage is applied are controlled by the photo-alignment film. By improving the anisotropy of the photosensitive film 31, the alignment regulating force of the photo-alignment film can be improved.

The photo-alignment film is, for example, a film in which the structure of a part of a material exhibiting photo alignment properties changes when the film is irradiated with polarized light 40. Examples of the photosensitive film 31 include a photosensitive film containing a photosensitive film material exhibiting photo-alignment properties.

Examples of the material exhibiting photo-alignment properties include a material containing a photoreactive portion (photo-alignable functional group) in which a reaction such as dimerization (dimer formation), isomerization, photo Fries rearrangement, or decomposition is caused by light irradiation. Examples of the photo-alignable functional groups that is dimerized and isomerized by light irradiation include a cinnamate group, a chalcone group, a coumarin group, and a stilbene group. Examples of the photo-alignable functional group that is isomerized by light irradiation include an azobenzene group and a tolane group. Examples of the photo-alignable functional group that is subjected to photo Fries rearrangement by light irradiation include a phenol ester structure. Examples of the photo-alignable functional group that is decomposed by light irradiation include a cyclobutane structure.

The photosensitive film 31 may have a polymer main chain having a polyamic acid structure, a polyimide structure, a polysiloxane structure, a polyvinyl structure, or a polyacryl structure or the like. The photosensitive film 31 may have a polymer main chain or side chain having the photo-alignable functional group.

The polarized light 40 is preferably linearly polarized light, and more preferably linearly polarized ultraviolet light. The wavelength of the polarized light 40 is preferably 200 to 500 nm, and more preferably 200 to 400 nm.

Figure 1A:
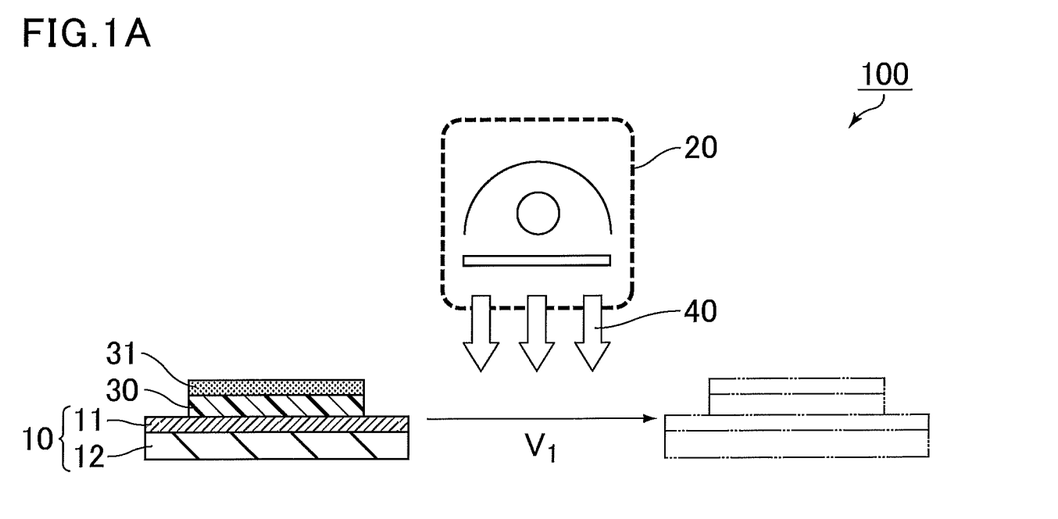
FIGS. 1A and 1B are schematic views showing a part of a polarized light irradiation apparatus of an embodiment 1 and an example of a photosensitive film-coated substrate manufacturing method using the polarized light irradiation apparatus of the embodiment 1.
Figure 1B:
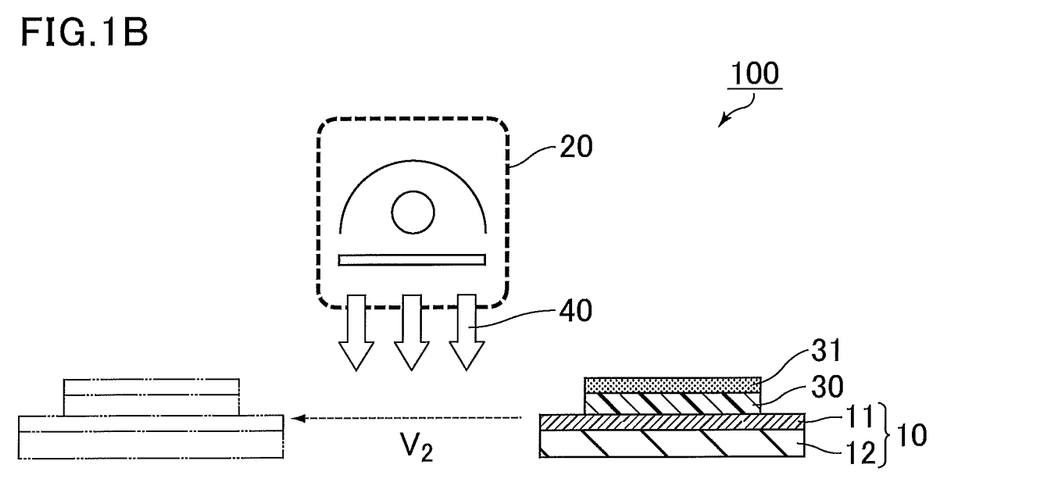

As shown in FIG. 1A, FIG. 1B, and FIG. 2, the photosensitive film 31 is provided on the substrate 30. In the irradiating, the photosensitive film 31 is irradiated with polarized light while the substrate 30 is heated and moved. In the irradiating, by irradiating the substrate 30 with polarized light while heating the substrate 30, the anisotropy of the photosensitive film 31 provided on the substrate 30 can be improved even with a low exposure amount.

Examples of a method of evaluating the anisotropy of the photosensitive film 31 include a method of measuring the refractive index anisotropy of the photosensitive film 31. The refractive index anisotropy is represented by the difference between a refractive index in a major axis direction and a refractive index in a minor axis direction of a polymer constituting the photosensitive film 31. Specifically, the refractive index anisotropy is determined by irradiating the photosensitive film 31 with light from a normal direction, receiving the light transmitted through the photosensitive film 31, measuring the retardation ($\Delta nd$) of the hotosensitive film 31, and then dividing the retardation ($\Delta nd$) of the photosensitive film 31 by a thickness d of the photosensitive film 31. The retardation $\Delta nd$ can be measured by using "Axo Scan FAA-3series" manufactured by Axo Metrics. The film thickness d can be measured according to contact type step difference measurement using a "full automatic high precision fine shape measuring machine ET 5000" manufactured by Kosaka Laboratories Co., Ltd.

Another examples of the evaluation method include a method of irradiating the photosensitive film 31 with light from an oblique direction and measuring the direction dependence property of the intensity of the light reflected on the surface of the photosensitive film 31. In this reflected light measurement, for example, the substrate 30 is rotated by 360° while the photosensitive film 31 is irradiated with light from the direction of an incident angle of 45° to change the direction angle of the irradiation light to 0 to 360°. By measuring the intensity of the reflected light for each direction angle, the anisotropy of the surface layer of the photosensitive film 31 can be confirmed. The reflected light can be measured by using, for example, "Lay Scan" manufactured by Moritex Corporation.

The method of evaluating the anisotropy of the photosensitive film 31 may be selected according to the material characteristics of the photosensitive film 31. Examples of a method of manufacturing an alignment film for a liquid crystal display device include a method of blending multiple alignment film materials and subjecting the blended product to layer separation to form an alignment film having a two-layer structure. The use of a material that can express a strong alignment regulating force to liquid crystal molecules for an upper layer (liquid crystal layer side), and a material that can increase the voltage holding ratio (VHR) of the liquid crystal layer for a lower layer (substrate side) and has excellent reliability makes it possible to provide a high-quality alignment film. In the case of such an alignment film having a two-layer structure, the lower layer does not contain a photosensitive component, whereby the measurement of the refractive index anisotropy due to transmitted light may make it impossible to provide a highly accurate output for anisotropy. Therefore, the reflected light measurement is effective for the alignment film having a two-layer structure. In general, as the incident angle of light on the photosensitive film 31 is decreased, an output corresponding to the state of the surface of the photosensitive film 31 can be obtained.

Figure 3:
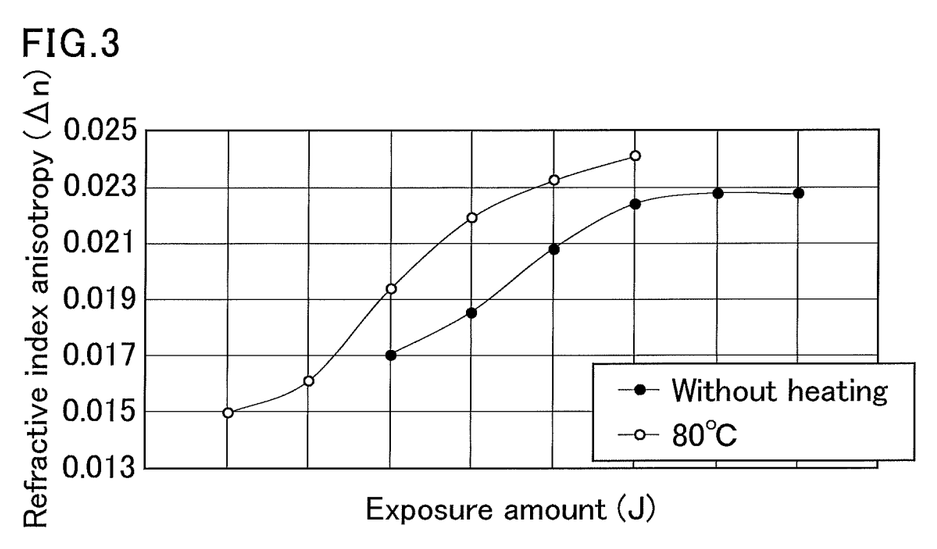
FIG. 3 is an example of a graph showing the temperature dependence property of refractive index anisotropy ($\Delta n$) with respect to an exposure amount (unit: J)

FIG. 3 is an example of a graph showing the temperature dependence property of refractive index anisotropy (Δn) with respect to an exposure amount (unit: J). From FIG. 3, it is found that, when the substrate 30 is heated to 80° C., the refractive index anisotropy of the photosensitive film 31 is higher even when the exposure amount is lower as compared with the case where the substrate 30 is not heated. From this, it is found that the refractive index anisotropy of the photosensitive film 31 can be improved when the substrate 30 is heated to 80° C. FIG. 3 shows data of a photosensitive film prepared by using an alignment material having a main chain that is polyamic acid, in which the main chain has an azobenzene group as a photo-alignable functional group.

The irradiating includes first irradiating performed by moving the substrate 30 at a first average speed $V_1$ and second irradiating performed by moving the substrate 30 at a second average speed $V_2$ lower than the first average speed $V_1$ after the first irradiating. The irradiating includes the first irradiating in which the moving speed of the substrate 30 is high and the second irradiating in which the moving speed of the substrate is slow, whereby the standby time until the substrate 30 is heated to a set temperature is eliminated to maximize the exposure amount, thereby allowing the anisotropy of the photosensitive film 31 to be improved.

Figure 4:
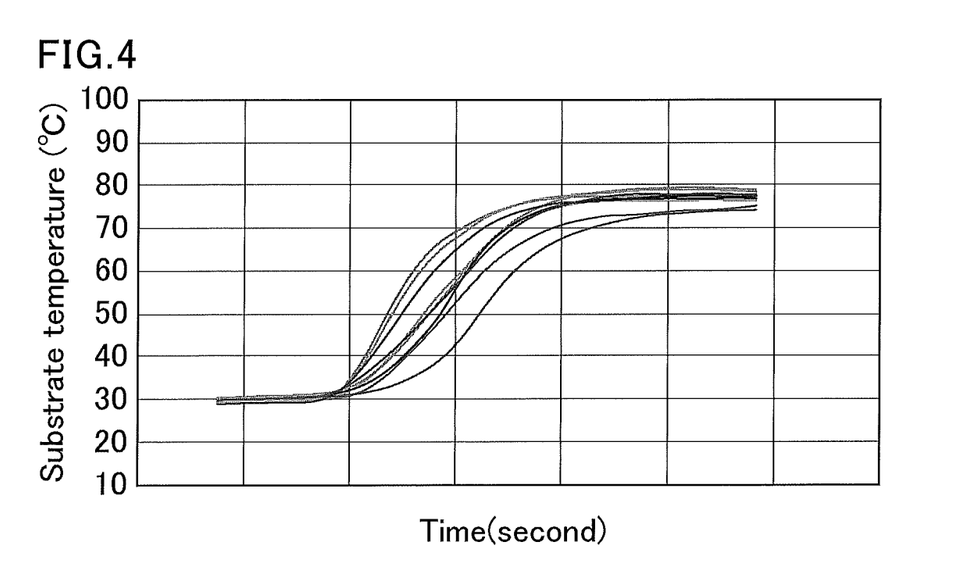
FIG. 4 is a graph showing a change in a substrate temperature when a substrate is placed on a stage surface set at 80° C.

FIG. 4 is a graph showing a change in a substrate temperature when a substrate is placed on a stage surface set at 80° C. The substrate temperature is subjected to multipoint measurement with multiple thermocouples attached to the surface of the substrate (glass plate) 30. From FIG. 4, it is found that the substrate temperature does not reach the set temperature immediately after the substrate 30 is placed on the stage surface, but is stable at around the set temperature after a certain period of time. That is, it is found that, when the irradiation of the photosensitive film 31 with polarized light is started immediately after the substrate 30 is placed on the stage surface, large unevenness occurs in the alignments of the polymers constituting the photosensitive film 31. Specifically, when the irradiation of the photosensitive film 31 with polarized light is started immediately after the substrate 30 is placed on the stage surface, the anisotropy on the exposure start side of the photosensitive film 31 is smaller than that on the exposure termination side of the photosensitive film 31, which causes increased variation in the in-plane anisotropy of the photosensitive film 31.

In order to eliminate the unevenness in the alignment of the polymers constituting the photosensitive film 31 due to the difference in the substrate temperature to suppress the in-plane variation in the anisotropy of the photosensitive film 31, it is common to take a standby time until the surface temperature of the substrate 30 is stable. However, if the standby time is taken when the treatment time from the start of heating of the substrate 30 to the completion of the irradiation of the photosensitive film 31 with polarized light is set as a given length of time, an exposure time is decreased, whereby the exposure amount of polarized light with which the photosensitive film 31 can be irradiated within the given length of treatment time is decreased. Therefore, an effect of allowing the anisotropy of the photosensitive film 31 that can be obtained even with a low exposure amount to be improved, i,e., an effect of polarized light irradiation upon heating is largely impaired. Therefore, a state where the surface temperature of the substrate 30 is unstable is referred to as first irradiating performed by moving the substrate 30 at a high speed, and a state where the surface temperature of the substrate 30 is stable is referred to as second irradiating performed by moving the substrate 30 at a low speed, whereby the standby time until the surface temperature of the substrate 30 is stable can be eliminated to maximize the exposure amount. Within the given length of treatment time, the exposure amount in the state where the surface temperature of the substrate 30 is stable exceeds the exposure amount when the standby time is taken. Furthermore, in the present embodiment, a time corresponding to the conventional standby time is used for the first irradiating, whereby the anisotropy of the photosensitive film 31 can be further improved.

The anisotropy of the photosensitive film 31 is improved by aligning the directions of the polymers constituting the photosensitive film 31. By irradiating the photosensitive film 31 with polarized light, first, polymers near the surface of the photosensitive film 31 are reacted, and polymers present in the thickness direction of the photosensitive film 31 are gradually reacted. If the alignments of the polymers near the surface of the photosensitive film 31 largely contribute to the alignment regulating force of the photosensitive film 31, and the alignments of the polymers near the surface of the photosensitive film 31 are nonuniform, the variation in the anisotropy of the surface layer of the photosensitive film 31 occurs. The variation in the anisotropy can be evaluated by subjecting the anisotropy of the photosensitive film 31 to in-plane multipoint measurement and comparing the maximum value of the anisotropy with the minimum value of the anisotropy.

The set temperature of the substrate 30 is preferably 50° C. or higher and 90° C. or lower. The lower limit of the temperature is more preferably 60° C.; the upper limit of the temperature is more preferably 85° C.; the lower limit of the temperature is still more preferably 70° C.; and the upper limit of the temperature is still more preferably 80° C.

The temperature of the substrate 30 in the first irradiating may not be maintained within a specific temperature range, and during the first irradiating, the temperature of the substrate 30 may be raised from room temperature to the set temperature, for example. The temperature of the substrate 30 in the second irradiating is preferably maintained within a specific temperature range, and more preferably maintained within a range of ±3° C. from the set temperature of the substrate 30.

The moving speed of the substrate 30 in the first irradiating may be a constant speed. The moving speed of the substrate 30 in the second irradiating may be a constant speed.

The average speed of the substrate 30 in the first irradiating is preferably higher than the average speed of the substrate 30 in the second irradiating, and in the first irradiating and the second irradiating, the moving speed of the substrate 30 may be accelerated or decelerated. By accelerating or decelerating the moving speed of the substrate 30 in the first irradiating, variation in anisotropy can be further reduced. By accelerating or decelerating the moving speed of the substrate 30 in the second irradiating, the moving speed of the substrate 30 in the second irradiating is changed according to the photoreactivity of the photosensitive film material with the lapse of time, whereby the refractive index anisotropy of the obtained photosensitive film 31 can be further uniformed.

Hereinafter, with reference to FIGS. 5 to 7, there will be described the reason why the anisotropy (refractive index anisotropy) of the photosensitive film 31 can be further uniformed by accelerating or decelerating the moving speed of the substrate 30 in each of the first irradiating and the second irradiating.

Figure 5:
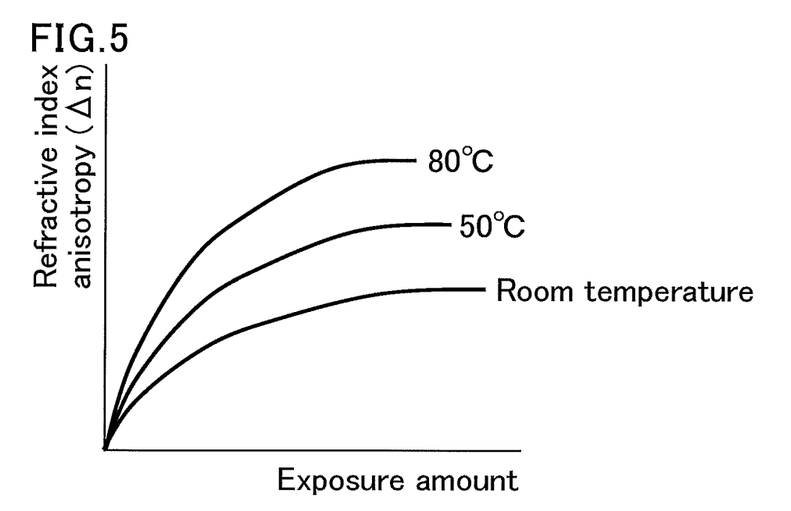
FIG. 5 is a graph showing the relationship between the exposure amount and the obtained refractive index anisotropy.

FIG. 5 is a graph showing the relationship between the exposure amount and the obtained refractive index anisotropy. FIG. 6 is a graph showing the volatilization amount of a solvent with the lapse of time. FIG. 7 is a graph showing the relationship between the volatilization amount of the solvent and the obtained refractive index anisotropy. FIGS. 5 and 7 show a typical behavior of the refractive index anisotropy of the photosensitive film 31. The absolute values of the refractive index anisotropies are different depending on the types of the photosensitive film materials, but the photosensitive film materials have the same basic tendency. From FIG. 5, it is found that the refractive index anisotropy also increases as the exposure amount increases, and is saturated when the exposure amount reaches a certain value. This saturation point is the reaction limit of the photosensitive film material constituting the photosensitive film 31, but from FIG. 5, it is found that the photoreactivity of the photosensitive film material is improved by heating the substrate.

Figure 6:
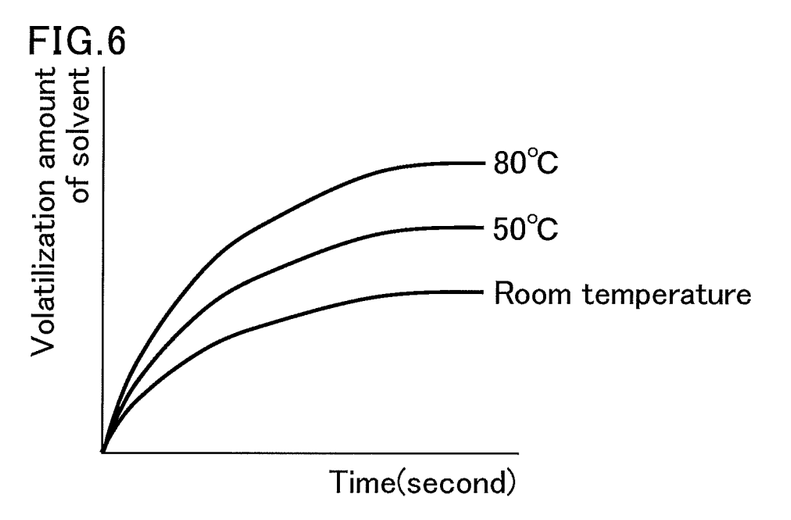
FIG. 6 is a graph showing the volatilization amount of a solvent with the lapse of time.
Figure 7:
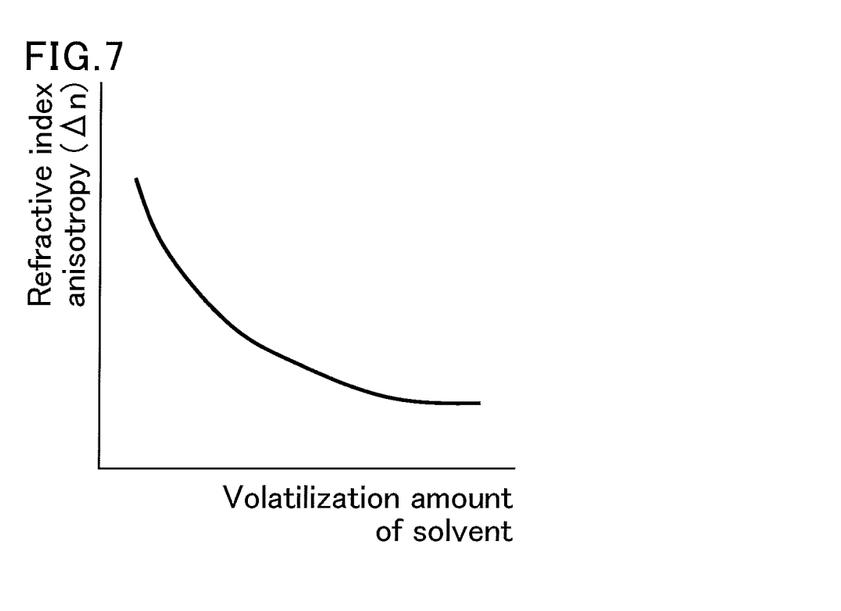
FIG. 7 is a graph showing the relationship between the volatilization amount of the solvent and the obtained refractive index anisotropy.

On the other hand, as shown in FIG. 6, the volatilization amount of the solvent tends to increase as the treatment time increases, and tends to increase as the heating temperature is higher. The volatilization amount of the solvent is different depending on the type of the solvent and the film formation method, but it shows the same tendency. The solvent is contained, whereby the flowability of the photosensitive film material is improved, and a uniform film thickness is provided in the film forming of the photosensitive film to allow the stability to be maintained. The solvent is contained, whereby the photoreactivity of the photosensitive film material can be improved. Therefore, as shown in FIG. 7, as the volatilization amount of the solvent increases, the photoreactivity of the photosensitive film material tends to be slow in the irradiating, and the refractive index anisotropy of the obtained photosensitive film also tends to decrease. From this, it is found that variation in the refractive index anisotropy of the photosensitive film 31 increases as the volatilization amount of the solvent increases with the elapse of the heating time. By heating the substrate 30, the photoreactivity of the photosensitive film material is improved, but if the solvent is excessively volatilized, the photoreactivity of the photosensitive film material is deteriorated, whereby the manufacturing conditions can be optimized by adjusting the balance between the heating condition and the volatilization amount of the solvent.

Figure 8:
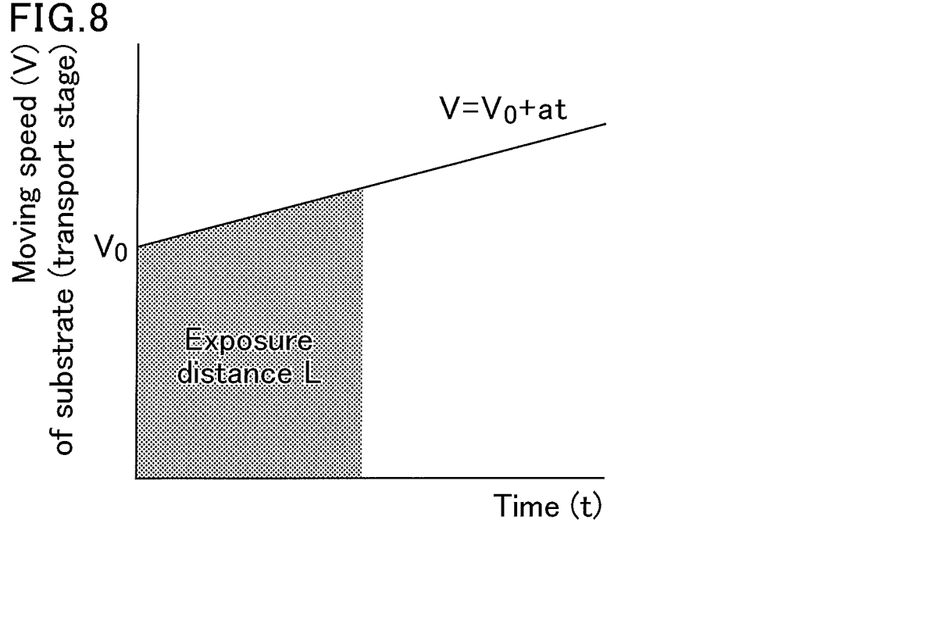
FIG. 8 is a graph showing the relationship between the moving speed of a substrate and an exposure distance when the substrate is caused to travel with a constant acceleration.

In the first irradiating and the second irradiating, the substrate 30 may be caused to travel with a constant acceleration. For example, an exposure distance L that is the sum of the length of the substrate (the width of the photosensitive film formed on the substrate) and a reserve width, an initial speed $V_0$, and an acceleration a are determined, and the substrate 30 can be caused to travel with a constant acceleration. FIG. 8 is a graph showing the relationship between the moving speed of a substrate and an exposure distance when the substrate is caused to travel with a constant acceleration. The constant acceleration traveling can be individually set in the first irradiating and the second irradiating according to the reactivity of the photosensitive film material. The acceleration a can also be set to either a positive value or a negative value depending on the reactivity of the photosensitive film material. The moving speed of the substrate is not constant, whereby the exposure amount is not constant, but in-plane variation in the refractive index anisotropy of the obtained photosensitive film 31 can be further suppressed. The in-plane variation in the refractive index anisotropy of the photosensitive film 31 can be reduced by 20 to 80% as compared with the case where the substrate is caused to travel at a high constant speed in the first irradiating, and the substrate is caused to travel at a low constant speed in the second irradiating.

When the first irradiating and the second irradiating are performed by reciprocating the substrate 30 in the irradiating, the first irradiating and the second irradiating can be performed by one polarized light irradiation apparatus. When the substrate 30 is reciprocated, the first irradiating and the second irradiating can be performed by the same polarized light irradiation mechanism.

Also in the case where the first irradiating and the second irradiating are performed without reciprocating the substrate 30 in the irradiating, the first irradiating and the second irradiating are preferably performed by one polarized light irradiation apparatus. When the substrate 30 is not reciprocated, the first irradiating and the second irradiating can be performed by different polarized light irradiation mechanisms.

The material of the substrate 30 may be glass such as alkali-free glass or a transparent resin such as acrylic resin or cycloolefin. When a photosensitive film-coated substrate manufactured by the polarized light irradiation apparatus of the embodiment 1 or 2 is for a display device such as a liquid crystal display device, the substrate 30 may be an active matrix substrate in which signal lines such as gate lines or source lines, thin-film transistors (TFT), and electrodes such as pixel electrodes or common electrodes are provided on a transparent substrate, or a color filter substrate in which color filters and black matrixes or the like are provided on a transparent substrate.

Figure 9:
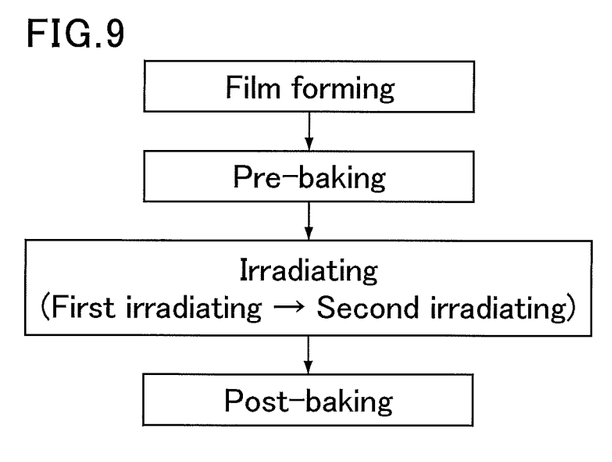
FIG. 9 is a flowchart showing an example of a photosensitive film-coated substrate manufacturing method of the present invention.

FIG. 9 is a flowchart showing an example of a photosensitive film-coated substrate manufacturing method of the present invention. The photosensitive film-coated substrate manufacturing method of the present embodiment may include film forming and pre-baking before irradiating. The method may include post-baking after the irradiating.

The film forming is a step of applying a photosensitive film composition on a substrate surface. The applying method is not particularly limited, and flexographic printing and inkjet coating or the like can be used. Examples of the photosensitive film composition include a photosensitive film composition containing a photosensitive film material and a solvent or the like.

The pre-baking is performed by volatilizing the solvent of the photosensitive film composition to adjust the flowability and layer separation state of the coating film. The temperature of the pre-baking is not particularly limited, but it is, for example, 50° C. to 90° C. For example, when the upper layer of the photosensitive film 31 is formed of a material having a photo-alignable functional group, and the lower layer is formed of another material for maintaining reliability, the coating film can be separated into two layers by the pre-baking.

The post-baking is performed by polymerizing the photosensitive film material to form polymers constituting the photosensitive film 31. By the post-baking, for example, a polymer main chain structure such as a polyamic acid structure, a polyimide structure, a polysiloxane structure, a polyvinyl structure, or a polyacrylic structure is formed. The temperature of the post-baking is not particularly limited, but it is, for example, 100° C. to 250° C.

[Polarized Light Irradiation Apparatus]

Hereinafter, the polarized light irradiation apparatus of the embodiment 1 will be described in detail with reference to FIGS. 1A and 1B. The polarized light irradiation apparatus of the embodiment 1 is a polarized light irradiation apparatus for exposure of a photosensitive film 31 on a substrate 30, the polarized light irradiation apparatus including: a transport stage 10 including a stage surface 11 that is reciprocated in a state where the substrate 30 is placed on the stage surface 11 and a heating mechanism 12 that heats the substrate 30 placed on the stage surface 11; and a polarized light irradiation mechanism 20 that irradiates the stage surface 11 moving in an exposure region with polarized light 40, wherein: the transport stage 10 moves in the exposure region at a first average speed $V_1$ in a forward path while the transport stage 10 causes the heating mechanism 12 to heat the substrate 30; and the transport stage moves in the exposure region at a second average speed $V_2$ lower than the first average speed $V_1$ in a backward path.

As shown in FIGS. 1A and 1B, a polarized light irradiation apparatus 100 includes a transport stage 10 and a polarized light irradiation mechanism 20. The polarized light irradiation apparatus 100 is used for exposure of the photosensitive film 31 provided on the substrate 30.

The transport stage 10 includes a stage surface 11 that is reciprocated in a state where the substrate 30 is placed on the stage surface 11, and a heating mechanism 12 that heats the substrate 30 placed on the stage surface 11. The transport stage 10 includes the heating mechanism 12, whereby the substrate 30 can be transported while the substrate 30 is heated.

The transport stage 10 is reciprocated in a state where the substrate 30 is placed on the stage surface 11. In the reciprocating, for example, the photosensitive film 31 provided on the substrate 30 passes through an exposure region in a certain direction, and then passes through the exposure region again. The reciprocating makes it possible to reduce the size of the polarized light irradiation apparatus 100. The high efficient exposure of the present invention can be satisfied. It is preferable that the polarized light irradiation apparatus 100 has one introducing-discharging port for introducing and discharging the substrate 30, and the substrate 30 is introduced and discharged at the same position.

The heating mechanism 12 is not particularly limited as long as it can heat the substrate 30. The heating mechanism 12 preferably heats the substrate 30 to a constant temperature and thereafter keeps the temperature of the substrate 30 constant. The heating mechanism 12 is not particularly limited, and examples thereof include a heating mechanism including a heater for heating the stage surface 11, a temperature measuring device for measuring the temperature of the stage surface 11, and a temperature control part that calculates a temperature difference between the temperature of the stage surface 11 obtained by the temperature measuring device and a set temperature, and supplies electric power to the heater according to the temperature difference or the like.

The set temperature of the heating mechanism 12 can be appropriately adjusted depending on the type of the photosensitive film material used for the photosensitive film 31, but it is preferably 50° C. or higher and 90° C. or lower. The lower limit of the temperature is more preferably 60° C.; the upper limit of the temperature is more preferably 85° C.; the lower limit of the temperature is still more preferably 70° C.; and the upper limit of the temperature is still more preferably 80° C.

The polarized light irradiation mechanism 20 irradiates the stage surface 11 moving in the exposure region with the polarized light 40. By irradiating the stage surface 11 with the polarized light 40, the polymers constituting the photosensitive film 31 can be aligned in a desired direction. Thereby, anisotropy can be expressed in the photosensitive film 31. The exposure region means a region irradiated with polarized light in the polarized light irradiation mechanism 20.

In the polarized light irradiation apparatus 100, polarized light irradiation in the forward path and the backward path may be performed by one polarized light irradiation mechanism 20.

The polarized light irradiation mechanism 20 is not particularly limited as long as it irradiates the stage surface 11 with the polarized light 40. The polarized light irradiation mechanism 20 includes, for example, a light source, a reflector (collector mirror), a polarizer, a wavelength selection filter, and a cover glass or the like. The polarized light 40 irradiated from the polarized light irradiation mechanism 20 is preferably linear polarized light, and more preferably linearly-polarized ultraviolet light.

The light source is not particularly limited, and there can be used a low pressure mercury lamp (sterilization lamp, fluorescent chemical lamp, black light), a high pressure discharge lamp (high pressure mercury lamp, metal halide lamp), a short arc discharge lamp (extra high pressure mercury lamp, xenon lamp, mercury xenon lamp), a light emitting diode (LED) emitting ultraviolet light, and a laser diode (LD) or the like. The light source may be a planar light irradiation part formed by combining a light source element with a magnifying glass, or may be a planar or linear light irradiation part formed by arranging multiple light source elements. In place of arranging multiple light source elements in one direction in order to form the linear light irradiation part, a rod-shaped discharge lamp that is long in one direction may be disposed.

The polarizer extracts polarized light, and preferably linearly polarized light, from the light emitted from the light source. Examples of the polarizer include an organic resin polarizer, a wire grid polarizer, a polarizing beam splitter (PBS), and a polarizer using a Brewster angle (angle at which reflected light of incident light is only S-polarized light containing no P-polarized light).

Examples of the organic resin polarizer include a polarizer obtained by adsorbing iodine onto polyvinyl alcohol, followed by stretching in a sheet form.

Examples of the wire grid polarizer include a wire grid polarizer including a light transmissive base material and multiple fine metal wires formed on the light transmissive base material, in which the fine metal wires are disposed with a period shorter than the wavelength of light incident on the wire grid polarizer. The fine metal wire is formed of a light absorbing metal material such as chromium, aluminum, or titanium oxide.

Examples of the polarizing beam splitter include a cube type splitter or a plate type splitter. Examples of the cube type PBS include a PBS in which inclined planes of two prisms are bonded to each other and an optical thin film is vapor-deposited on one of the inclined planes.

The dominant wavelength of the light irradiated through the wavelength selection filter is preferably 200 to 500 nm, and more preferably 200 to 400 nm. The wavelength selection filter is not particularly limited, and a wavelength selection filter usually used in the field of a photo-alignment treatment apparatus can be used. Examples of the wavelength selection filter include a filter in which a substance that absorbs a wavelength other than a transparent wavelength is dispersed, and a filter having a surface coated with a substance that reflects a wavelength other than a transparent wavelength.

The transport stage 10 moves in the exposure region at the first average speed $V_1$ as shown in FIG. 1A while the transport stage 10 causes the heating mechanism 12 to heat the substrate 30. Thereafter, as shown in FIG. 1B, the transport stage 10 moves in the exposure region at the second average speed $V_2$ lower than the first average speed $V_1$. By changing the speed of the transport stage 10, the standby time until the substrate 30 is heated to the set temperature is eliminated to maximize the exposure amount, thereby allowing the anisotropy of the photosensitive film 31 to be improved.

The first average speed $V_1$ is set, for example, by the width of the photosensitive film 31 in the movement direction of the transport stage 10, and the time required for the surface temperature of the substrate 30 to reach the set temperature, or the like. The second average speed $V_2$ is set, for example, by the type of the photosensitive film material for the photosensitive film 31, and the exposure time or the like.

The speed of the transport stage 10 moving at the first average speed $V_1$ may be a constant speed. The speed of the transport stage 10 moving at the second average speed $V_2$ may be a constant speed.

The average speed of the transport stage 10 moving at the first average speed $V_1$ is preferably higher than the average speed of the transport stage 10 moving at the second average speed $V_2$, and the speed of the transport stage 10 moving at the first average speed $V_1$ and the speed of the transport stage 10 moving at the second average speed $V_2$ may be accelerated or decelerated.

Hereinafter, with reference to FIG. 2, a polarized light irradiation apparatus of an embodiment 2 will be described in detail. The polarized light irradiation apparatus of the embodiment 2 is a polarized light irradiation apparatus for exposure of a photosensitive film 31 on a substrate 30, the polarized light irradiation apparatus includes a transport stage 10 including a stage surface 11 that moves in a state where the substrate 30 is placed on the stage surface 11, and a heating mechanism 12 that heats the substrate 30 placed on the stage surface 11, and a first polarized light irradiation mechanism 20 and a second polarized light irradiation mechanism and 21 that irradiates the stage surface 11 moving in an exposure region with polarized light 40. The transport stage 10 moves in the exposure region of the first polarized light irradiation mechanism 20 at a first average speed $V_1$ while the transport stage 10 causes the heating mechanism 12 to heat the substrate 30, and then moves in the exposure region of the second polarized light irradiation mechanism 21 at a second average speed $V_2$ lower than the first average speed $V_1$.

As shown in FIG. 2, a polarized light irradiation apparatus 200 according to the embodiment 2 includes the first polarized light irradiation mechanism 20 and the second polarized light irradiation mechanism 21. As the first polarized light irradiation mechanism 20 and the second polarized light irradiation mechanism 21, the polarized light irradiation mechanism 20 described in the embodiment 1 can be used. The same reference numerals are given in the figure to the same configurations as those in the embodiment 1, and the description of each of the configurations will be omitted.

In the polarized light irradiation apparatus 200 according to the embodiment 2, the transport stage 10 moves in the exposure region of the first polarized light irradiation mechanism 20 at the first average speed $V_1$ while the transport stage 10 causes the heating mechanism 12 to heat the substrate 30, and then moves in the exposure region of the second polarized light irradiation mechanism 21 at the second average speed $V_2$ lower than the first average speed $V_1$. Such a configuration makes it possible to perform the first irradiating and the second irradiating described above without changing the traveling direction of the substrate 30 even if the substrate 30 is not reciprocated.

The polarized light irradiation apparatus 200 may have an introducing port and a discharging port for the substrate 30 at different positions, and the substrate 30 may be introduced and discharged at different positions.

The polarized light irradiation apparatuses 100 and 200 can be used for manufacturing a photosensitive film-coated substrate. In particular, it is suitable for manufacturing a substrate including the photosensitive film 31 with improved anisotropy. The polarized light irradiation apparatuses 100 and 200 can be suitably used for manufacturing a substrate with photo-alignment film used for a display device such as a liquid crystal display device. The photosensitive film obtained by the polarized light irradiation apparatus and the photosensitive film-coated substrate manufacturing method of the present invention have improved anisotropy, whereby the use of the substrate provided with the photosensitive film makes it possible to prepare a liquid crystal panel in which the initial alignments of liquid crystal molecules are precisely controlled when no voltage is applied. The polarized light irradiation apparatus and the photosensitive film-coated substrate manufacturing method of the present invention can be used for hardening a sealant. Examples of a method of preparing a liquid crystal panel constituting a liquid crystal display device include a liquid crystal dropping method (ODF) in which a liquid crystal composition is dropped onto one substrate, and the substrate and the other substrate are then bonded with a sealant. The use of the polarized light irradiation apparatus and the photosensitive film-coated substrate manufacturing method of the present invention for hardening the sealant for ODF makes it possible to harden the sealant without masking the display area of the liquid crystal display device.

EXAMPLES

Hereinafter, the present invention will be described in more detail with reference to examples, but the present invention is not limited to these examples.

Example 1

A photosensitive film-coated substrate according to Example 1 was prepared by the following method. First, on the surface of a glass plate having a length of 880 mm, a width of 680 mm, and a thickness of 0.63 mm (AN 100 manufactured by Asahi Glass Co., Ltd.), an alignment film composition was applied, which contained an alignment material having a main chain that was polyamic acid, in which the main chain had an azobenzene group as a photo-alignable functional group, and a solvent, thereby forming a coating film, followed by pre-baking.

Thereafter, by using a polarized light irradiation apparatus including a transport stage including a stage surface and a heater as a heating mechanism, and a polarized light irradiation mechanism including a metal halide lamp, a collector mirror, a wire grid polarizer, and a wavelength selection filter as a light source, the coating film was irradiated with polarized light. The polarized light irradiation apparatus included one port for introducing and discharging a substrate, and the substrate was introduced and discharged at the same position. The set temperature of the stage surface was set to 80° C., and the substrate was irradiated with linearly polarized ultraviolet light having a central wavelength of 370 to 380 nm from the polarized light irradiation mechanism. The substrate was irradiated with linearly polarized ultraviolet light while the glass substrate was reciprocated along the longitudinal direction of the glass substrate without taking a standby time until the temperature of the stage surface reached the set temperature. The transport stage was moved at a constant speed of 120 mm/sec in a forward path while the transport stage was heated; the substrate was irradiated with linearly polarized ultraviolet light for 15 seconds; the transport stage was moved at a constant speed of 35 mm/sec in a backward path while the transport stage was heated; and the substrate was irradiated with linearly polarized ultraviolet light for 50 seconds.

After the linearly polarized ultraviolet light irradiation, post-baking was performed to complete a photosensitive film-coated substrate according to Example 1.

Example 2

A photosensitive film-coated substrate according to Example 2 was prepared in the same manner as in Example 1 except that polarized light irradiation conditions in a forward path were changed. In Example 2, a standby time was not taken; in a forward path, an initial speed was 108 mm/sec, and a final speed was 132 mm/sec; and a transport stage was moved with a constant acceleration while the transport stage was heated, and irradiated with linearly polarized ultraviolet light for 15 seconds. In the same manner as in Example 1, in a backward path, the transport stage was moved at a constant speed of 35 mm/sec while the transport stage was heated, and irradiated with linearly polarized ultraviolet light for 50 seconds.

Comparative Example 1

A photosensitive film-coated substrate according to Comparative Example 1 was prepared in the same manner as in Example 1 except that a standby time was taken, and polarized light irradiation conditions in a forward path and a backward path were changed. In Comparative Example 1, a standby time until the in-plane temperature of the photosensitive film reached a set temperature was set to 15 seconds. A transport stage was moved at a constant speed of 70 mm/sec while the transport stage was heated in the forward path and the backward path, and the substrate was irradiated with linearly polarized ultraviolet light so that the total of irradiation times in the forward path and the backward path was set to 50 seconds.

Comparative Example 2

A photosensitive film-coated substrate according to Comparative Example 2 was prepared in the same manner as in Example 1 except that polarized light irradiation conditions in a forward path and a backward path were changed. In Comparative Example 2, a standby time was not taken; and a transport stage was moved at a constant speed of 55 mm/sec while the transport stage was heated in a forward path and a backward path, and the substrate was irradiated with linearly polarized ultraviolet light so that the total of irradiation times in the forward path and the backward path was set to 65 seconds.

<Measurement of Refractive Index Anisotropy>

The photosensitive film-coated substrate obtained in each of the above examples and comparative examples was measured for the refractive index anisotropy of the photosensitive film. The above refractive index anisotropy was calculated by irradiating each photosensitive film with light from a normal direction, measuring the retardation of transmitted light, and dividing the obtained value by the film thickness of each photosensitive film. The retardation was measured by using "Axo Scan FAA-3series" manufactured by Axo Metrics. The film thickness was measured according to contact type step difference measurement using a "full automatic high precision fine shape measuring machine ET 5000" manufactured by Kosaka Laboratories Co., Ltd. The retardation was measured by subjecting each photosensitive film to in-plane multipoint measurement, and the variation in the refractive index anisotropy of the photosensitive film was also evaluated based on the difference between the maximum and minimum values of the obtained retardation.

<Results and Discussions>

In Example 1, the refractive index anisotropy was improved by 10 to 20% with respect to that in Comparative Example 1. In Comparative Example 1, the standby time was taken, and the exposure amount of the light with which the coating film was irradiated within the given length of treatment time was smaller than that in Example 1, whereby the refractive index anisotropy was small.

In Comparative Example 2, the standby time was not taken, and the exposure amount of the light with which the coating film was irradiated within the given length of treatment time was the same as that in Example 1, whereby the refractive index anisotropy comparable with that in Example 1 was obtained. However, irradiation in the forward path was started before the in-plane temperature of the photosensitive film reached the set temperature. Furthermore, the average speeds in the forward path and the backward path were the same, whereby the variation in the refractive index anisotropy was greater than that in Example 1.

In Example 2, the standby time was not taken, and the exposure amount of the light with which the coating film was irradiated within the given length of treatment time was the same as that in Example 1, whereby the refractive index anisotropy comparable with that in Example 1 was obtained. Furthermore, the constant acceleration movement that accelerated the moving speed of the transport stage was provided in the forward path, whereby the variation in the refractive index anisotropy could be reduced by 20% or more with respect to Example 1.

What is claimed is:

1. A polarized light irradiation apparatus for exposure of a photo-alignment film on a substrate, the polarized light irradiation apparatus comprising:
    a transport stage including a stage surface configured to reciprocate in a state where the substrate is placed on the stage surface and a heating mechanism configured to heat the substrate placed on the stage surface; and
    a polarized light irradiation mechanism configured to irradiate the stage surface moving in an exposure region with polarized light,
    the transport stage moving in the exposure region at a first average speed in a forward path while heating the substrate and raising a temperature of the substrate to a set temperature by the heating mechanism,
    the transport stage moving in the exposure region at a second average speed lower than the first average speed in a backward path while heating the substrate and maintaining the temperature of the substrate within a range of ±3° C. from the set temperature by the heating mechanism.

2. The polarized light irradiation apparatus according to claim 1,
wherein a speed of the transport stage moving at the first average speed is a constant speed.

3. The polarized light irradiation apparatus according to claim 1,
wherein a speed of the transport stage moving at the first average speed is accelerated or decelerated.

4. The polarized light irradiation apparatus according to claim 1,
wherein a speed of the transport stage moving at the second average speed is a constant speed.

5. The polarized light irradiation apparatus according to claim 1,
wherein a speed of the transport stage moving at the second average speed is accelerated or decelerated.

6. A polarized light irradiation apparatus for exposure of a photo-alignment film on a substrate, the polarized light irradiation apparatus comprising:
a transport stage including a stage surface configured to move in a state where the substrate is placed on the stage surface and a heating mechanism configured to heat the substrate placed on the stage surface; and
a first polarized light irradiation mechanism and a second polarized light irradiation mechanism configured to irradiate the stage surface moving in an exposure region with polarized light,
the transport stage moving in the exposure region of the first polarized light irradiation mechanism at a first average speed while heating the substrate and raising a temperature of the substrate to a set temperature by the heating mechanism, and then moving in the exposure region of the second polarized light irradiation mechanism at a second average speed lower than the first average speed while heating the substrate and maintaining the temperature of the substrate within a range of ±3° C. from the set temperature by the heating mechanism.

7. A photo-alignment film-coated substrate manufacturing method for irradiating a photo-alignment film on a substrate with polarized light, the photo-alignment film-coated substrate manufacturing method comprising irradiating the photo-alignment film with polarized light while heating and moving the substrate,
the irradiating including first irradiating performed by moving the substrate at a first average speed while heating the substrate and raising a temperature of the substrate to a set temperature and second irradiating performed by moving the substrate after the first irradiating at a second average speed lower than the first average speed while heating the substrate and maintaining the temperature of the substrate within a range of ±3° C. from the set temperature.

8. The photo-alignment film-coated substrate manufacturing method according to claim 7,
wherein the irradiating is performed by irradiating the photo-alignment film with polarized light while reciprocating the substrate;
the first irradiating is performed in a forward path; and
the second irradiating is performed in a backward path.

9. The photo-alignment film-coated substrate manufacturing method according to claim 7,
wherein a moving speed of the substrate in the first irradiating is a constant speed.

10. The photo-alignment film-coated substrate manufacturing method according to claim 7,
wherein a moving speed of the substrate in the first irradiating is accelerated or decelerated.

11. The photo-alignment film-coated substrate manufacturing method according to claim 7,
wherein a moving speed of the substrate in the second irradiating is a constant speed.

12. The photo-alignment film-coated substrate manufacturing method according to claim 7,
wherein a moving speed of the substrate in the second irradiating is accelerated or decelerated.

* * * * *